(12) United States Patent
Randall et al.

(10) Patent No.: US 6,815,942 B2
(45) Date of Patent: Nov. 9, 2004

(54) SELF-CALIBRATING ELECTRICITY METER

(75) Inventors: Bruce E. Randall, Rock Hill, SC (US); Byron J. Slater, Hermosa Beach, CA (US); Rongsheng Wang, Lafayette, IN (US); Gordon R. Burns, West Lafayette, IN (US); Warren T. Martin, Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 0 days.

(21) Appl. No.: 10/256,241

(22) Filed: Sep. 25, 2002

(65) Prior Publication Data

US 2003/0151415 A1 Aug. 14, 2003

(Under 37 CFR 1.47)

Related U.S. Application Data

(60) Provisional application No. 60/325,075, filed on Sep. 25, 2001.

(51) Int. Cl.[7] .............................................. G01R 11/32
(52) U.S. Cl. ............................ 324/142; 324/74; 702/61
(58) Field of Search ........................ 324/74, 96, 103 R, 324/107, 113–115, 141–142; 702/61–62, 64–65, 82; 340/870.02, 661–664

(56) References Cited

U.S. PATENT DOCUMENTS

| | | | |
|---|---|---|---|
| 4,837,504 A | 6/1989 | Baer et al. | |
| 4,949,029 A | 8/1990 | Cooper et al. | |
| 5,399,963 A | 3/1995 | Manser et al. | |
| 5,495,167 A | 2/1996 | Cotroneo | |
| 5,537,029 A | * 7/1996 | Hemminger et al. | ........ 324/142 |
| 5,539,304 A | 7/1996 | Payne et al. | |
| 5,668,705 A | * 9/1997 | Balch et al. | ............. 363/21.16 |
| 5,699,051 A | * 12/1997 | Billig et al. | ................ 340/657 |
| 5,706,214 A | 1/1998 | Putt et al. | |
| 5,715,390 A | * 2/1998 | Hoffman et al. | ............ 713/202 |
| 5,821,742 A | 10/1998 | Carr et al. | |
| 6,084,394 A | 7/2000 | Windsheimer et al. | |
| 6,112,159 A | * 8/2000 | Bond et al. | ................... 702/61 |
| 6,133,720 A | 10/2000 | Elmore | |
| 6,429,785 B1 | * 8/2002 | Griffin et al. | ............ 340/70.02 |

OTHER PUBLICATIONS

"LP295/LP2952A/LP2953/LP2953A Adjustable Micropower Low–Dropout Voltage Regulators," National Semiconductor, © May 1999, (18 pages).

* cited by examiner

*Primary Examiner*—Minh N. Tang
(74) *Attorney, Agent, or Firm*—Maginot, Moore & Beck

(57) ABSTRACT

An electricity meter performs a self-calibration operation. According to an exemplary embodiment, the meter includes a measurement circuit for generating power information representative of measured power. A controller is operably coupled to the measurement circuit and includes an input for receiving reference standard information. The controller compares the power information generated by the measurement circuit to the reference standard information and generates a compensation signal in dependence upon the comparison. The compensation signal is used to calibrate the measurement circuit. Preferably, the meter is capable of being electrically connected to, and calibrated concurrently with at least one other meter.

32 Claims, 7 Drawing Sheets

SELF-CALIBRATING ELECTRICITY METER

This application claims the benefit of U.S. Provisional Patent Application serial No. 60/325,075, filed Sep. 25, 2002.

FIELD OF THE INVENTION

The present invention generally relates to electricity meters, and more particularly, to self-calibrating electricity meters suitable for use in polyphase power configurations.

BACKGROUND OF THE INVENTION

Electrical utility service providers, or simply utilities, generate polyphase electrical power, and typically three phase power. Polyphase electrical power is alternating current ("AC") electrical power that is supplied on a plurality of power supply lines wherein the voltage waveform on each of the power supply lines has a unique phase angle. While only a single phase of the polyphase electrical power may typically be provided for single family residences, true polyphase electrical power is typically provided to larger facilities such as commercial and industrial facilities.

Utilities monitor energy usage by customers through electricity meters. Electricity meters track among other things, the amount of energy consumed, typically measured in kilowatt-hours ("kwh"), at each customer's facility. The utility uses the consumption information primarily for billing, but also for resource allocation planning and other purposes.

Utilities are frequently required by state or local regulations or by energy customers to verify the accuracy of electricity meters operating in the field. To satisfy these requirements, utilities typically test the accuracy of each meter upon receipt from a manufacturer. Should the results of such testing indicate that a given meter is not operating at a desired degree of accuracy, the meter is adjusted so as to improve its accuracy. This process of testing and adjusting is often referred to as calibration.

In general, calibration typically involves comparing a power reading obtained using a meter under test against that measured by a standard meter, and adjusting the former as appropriate. Conventionally, the process of calibrating an electricity meter has required a separate computing device to calculate calibration data (e.g., coefficients) which are used to adjust the meter. Accordingly, there is a need for an electricity meter that is capable of internally calculating calibration data, thereby performing a calibration operation without the need for a separate computing device. That is, it is desirable for a meter to perform "self-calibration." Moreover, it is also desirable to provide a configuration where a plurality of such self-calibrating meters can be calibrated at the same time. The present invention addresses these and other problems.

SUMMARY OF THE INVENTION

According to the present invention, a self-calibrating electricity meter includes a measurement circuit for generating power information representative of measured power. A controller is operably coupled to the measurement circuit and includes an input for receiving reference standard information. The controller compares the power information generated by the measurement circuit to the reference standard information and generates a compensation signal in dependence upon the comparison. The compensation signal is used to calibrate the measurement circuit. Preferably, the meter is capable of being electrically connected to, and calibrated concurrently with at least one other meter.

According to an aspect of the invention, the measurement circuit multiplies current measurement signals by a scalar quantity in dependence upon the compensation signal. According to another aspect of the invention, the measurement circuit imposes a time delay upon current measurement signals in dependence upon the compensation signal.

According to a preferred embodiment, the self-calibrating meter includes a display for providing a visual indication of a calibration state of the meter. According to an aspect of the invention, the display illuminates a green light to indicate that the meter has been successfully calibrated. According to another aspect of the invention, the display illuminates a red light to indicate that the meter has been unsuccessfully calibrated. According to yet another aspect of the invention, the display illuminates a yellow light to indicate that calibration is in progress.

According to a preferred embodiment, the calibration is performed in a plurality of intervals, wherein a first interval is used to calibrate current magnitude measurements, a second interval is used to calibrate current phase angle measurements, and a third interval is used to verify calibration of the current magnitude measurements and the current phase angle measurements.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

DESCRIPTION OF THE PREFERRED EMBODIMENTS

Figure 1:
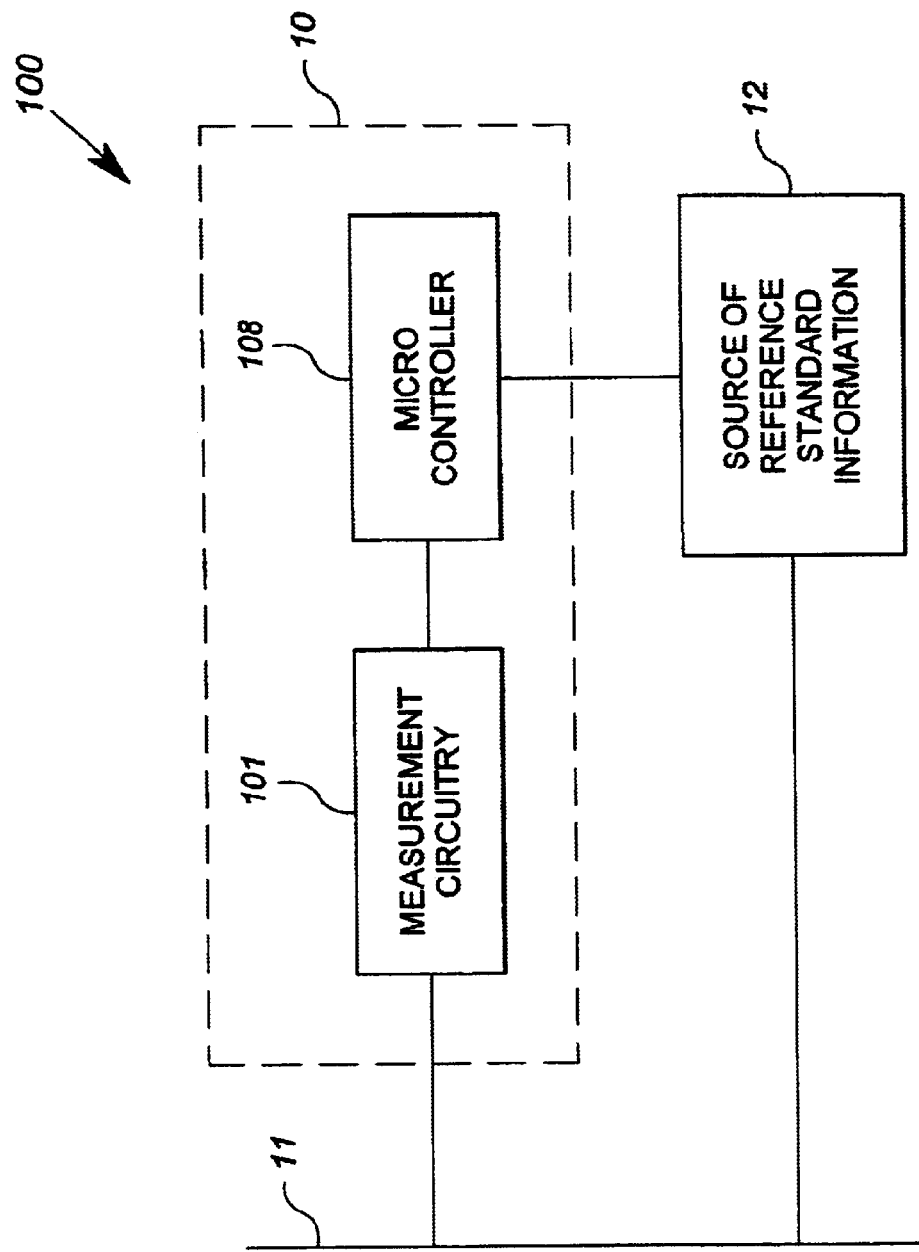
FIG. 1 is a schematic diagram of an exemplary configuration suitable for practicing the present invention.

Referring now to the drawings, and more particularly to FIG. 1, a schematic diagram of an exemplary configuration suitable for practicing the present invention is shown. In FIG. 1, the configuration 100 includes an exemplary electricity meter 10, a power line 11 and a source of reference standard information 12. The meter 10 includes measurement circuitry 101 and a microcontroller 108. The meter 10 is electrically connected to the power line 11 and, among other things, measures power consumption by a load, not shown. As will be described herein, the meter 10 also performs a self-calibration operation. The source of reference standard information 12 is also electrically connected to the power line 11, and is a highly accurate power measurement device such as a watt hour standard meter, which is known in the art.

In operation, electrical power provided via the power line 11 is received by the meter 10 and the source of reference standard information 12. In particular, the measurement circuitry 101 of the meter 10 performs measurements based on the electrical power provided via the power line 11 and provides its measurements to the microcontroller 108. Similarly, the source of reference standard information 12 also performs measurements based on the electrical power provided via the power line 11 and provides its measurements to the microcontroller 108. The microcontroller 108 compares the measurements provided by the measurement circuitry 101 to the measurements provided by the source of reference standard information 12, and based on the comparison performs a corresponding self-calibration operation of the meter 10. Further details regarding these operations will be provided later herein.

Figure 2:
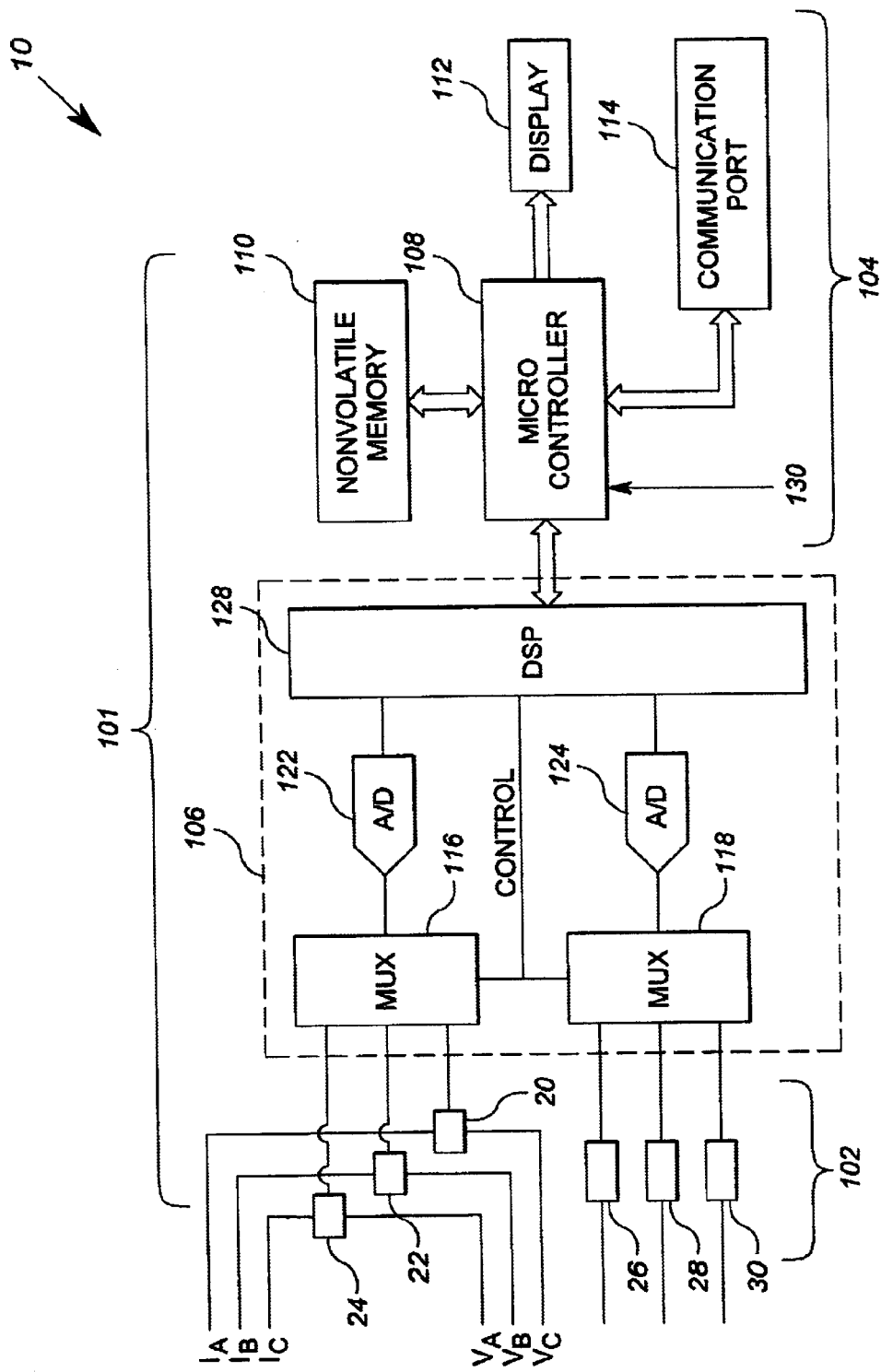
FIG. 2 is a schematic diagram showing further details of the exemplary electricity meter of FIG. 1.

Referring now to FIG. 2, a schematic diagram showing further details of the exemplary electricity meter 10 of FIG. 1 is shown. In FIG. 2, the meter 10 includes the measurement circuitry 101 and control circuitry 104. The measurement circuitry 101 includes sensor circuitry 102 and a conversion circuit 106. According to an exemplary embodiment, the measurement circuitry 101 also includes the microcontroller 108 and a nonvolatile memory 110. However, as shown in FIG. 2, the microcontroller 108 and the nonvolatile memory 110 are also included in the control circuitry 104. The sensor circuitry 102 includes polyphase current sensors 20, 22 and 24, and polyphase voltage sensors 26, 28 and 30. The control circuitry 104 includes the microcontroller 108, the nonvolatile memory 110, a display 112, and a communication port 114. The conversion circuit 106 comprises a first multiplexer 116, a second multiplexer 118, a first analog-to-digital ("A/D") converter 122, a second A/D converter 124 and a digital signal processor ("DSP") 128. It will be noted that a three-phase electrical meter is given by way of example only. Those of ordinary skill in the art may readily adapt the inventive aspects of present invention to other types of meters, such as single phase or network meters.

The current sensors 20, 22 and 24 are each connected to receive signals indicative of the current flowing through one phase of a three phase the power line (i.e., phase A, phase B, and phase C). The current sensors 20, 22 and 24 of the exemplary embodiment described herein preferably each include transformers (not shown in FIG. 2), which are advantageously situated to detect current on each respective phase of the power line. The current sensors 20, 22 and 24 are further connected to the first multiplexer 116 of the conversion circuit 106.

The voltage sensors 26, 28 and 30 are each connected to the respective phase of the power line (i.e., phase A, phase B, and phase C) to obtain a voltage measurement therefrom. To this end, the voltage sensors 26, 28 and 30 may suitably comprise high resistance voltage dividers. The voltage sensors 26, 28 and 30 are further connected to the second multiplexer 118 of the conversion circuit 106.

The conversion circuit 106 is a circuit operable to receive polyphase voltage and polyphase current measurement signals and generate digital signals therefrom, the digital signals including a power consumption signal and voltage and current signals. In the exemplary embodiment described herein, the conversion circuit 106 comprises the first and second multiplexers 116 and 118, respectively, the first and second A/Ds 122 and 124, respectively, and the DSP 128. The above listed components of the conversion circuit 106 may suitably be incorporated onto a single semiconductor substrate. Such devices are well known and could include the Power Measurement Integrated Circuit found in a model 54 electrical utility meter available from Landis+Gyr Inc. of Lafayette; Ind.

The controller 108 is operably configured to, and executes programming instructions to, receive the digital signals from the conversion circuit 106, monitor and record power consumption using the digital signals, and analyze the digital voltage and current measurement signals and associated phase angle data to determine whether one or more measurement errors is present. The controller 108 may suitably be a K0 series microcontroller available from NEC. However, the controller 108 may alternatively comprise any other suitable processing device or circuit. The controller 108 generally includes firmware, or in other words, an integrated memory into which programming instructions are stored. Alternatively, the programming instructions may be stored in the nonvolatile memory 110.

In operation, the current sensor circuits 20, 22 and 24 detect the phase A current, the phase B current, and the phase C current, respectively, and generate current measurement signals therefrom. The current sensor circuits 20, 22 and 24 may suitably generate the three phase measurement signals contemporaneously and continuously. The current sensor circuits 20, 22 and 24 provide the phase A, phase B and phase C measurement signals, respectively, to the first multiplexer 116. The current measurement signals typically have a voltage level that is indicative of the instantaneous current level on their respective phases. For current transformers designed for utility meter use, the current measurement signals measure from approximately 0.0 volts to 0.3 volts maximum. Other scaling factors may of course be employed.

The first multiplexer 116, under the control of the controller 108, then provides the instantaneous current measurement signal from one of the phase A, phase B, or phase C current measurement signals to the first A/D converter 122. The first multiplexer 116 typically provides each phase in rapid succession of cycles, such that each phase is provided to the first A/D converter 122 every third cycle. According to the exemplary embodiment described herein, the first multiplexer 116 provides the current measurement signals to the first A/D converter 122 at a rate of 2721 Hz.

The first A/D converter 122 receives and samples or digitizes the rapid succession of instantaneous current measurement signals. The first A/D converter 122 then provides to the DSP 128 a stream of digital words, each representing the magnitude of one of the three phase currents at a particular instant.

Contemporaneously, the voltage sensor circuits 26, 28 and 30 detect the phase A voltage, the phase B voltage, and the phase C voltage, respectively, and generate voltage measurement signals therefrom. The voltage sensor circuits 26, 28 and 30 provide the phase A voltage measurement signal, the phase B voltage measurement signal, and the phase C voltage measurement signal, respectively, to the second multiplexer 118. Each voltage measurement signal is typically a signal having a voltage level that is indicative of the instantaneous voltage level on its respective phase. In the exemplary embodiment described herein, the voltage sensors are configured to provide voltage measurement signals that range from approximately 0.0 volts to 0.3 volts maximum. Other scaling factors may of course be employed.

The second multiplexer 118 then provides each phase voltage measurement signal in a rapid succession of sequences, such that each phase voltage is provided to the second A/D converter 124 every third step of the sequence. According to the exemplary embodiment described herein, the second multiplexer 118 provides the voltage measurement signals at the same rate as that used by the first multiplexer 116 to provide the current measurement signals to the first A/D converter 122. Moreover, the first multiplexer 116 and the second multiplexer 118 operate in a coordinated fashion to provide certain phase current measurement signals at the same time as certain phase voltage measurement signals. For example, in a four wire wye meter wiring configuration, the first multiplexer 116 provides the phase x current measurement signal and the second multiplexer 118 provides the phase x voltage measurement signal contemporaneously, where x rotates among A, B and C.

The second A/D converter 124 receives and samples or digitizes the rapid succession of instantaneous voltage measurement signals. The second A/D converter 124 thus provides to the DSP 128 a stream of digital words or samples, each representing the magnitude of one of the three phase voltage measurement signals at a particular instant. The first A/D converter 122 and the second A/D converter 124 thus provide the digital current and voltage measurement signals in a predetermined synchronous phase relationship. The DSP 128 within the conversion circuit 106 determines power consumption by selectively multiplying the digital voltage measurement signal samples and the digital current measurement signal samples received from the A/D converters 122 and 124, and then adding them together.

In particular, in a four wire wye meter wiring configuration, the appropriate power calculation is:

$$\text{POWER} = V_A I_A + V_B I_B + V_C I_C \quad (1)$$

The DSP 128 carries out the above calculation in the manner described herebelow. The DSP 128 receives from the A/D converters 122 and 124 a digital current measurement signal sample and a voltage measurement signal sample. The DSP 128 multiplies the received samples, and the resulting product is added to a running total or sum. The DSP 128 then receives the next set of digital current and voltage measurement signal samples and repeats the process. In other words, if $\text{DIG\_VOLT}_x$ is the digital voltage measurement signal for a phase x and $\text{DIG\_CURR}_x$ is the digital current measurement signal for the phase x, then the DSP 128 carries out the following calculation:

$$\text{POWER} = SUM(\text{DIG\_VOLT}_x * \text{DIG\_CURR}_x) \text{ for } x = \{A,B,C,A,B, \ldots\} \quad (2)$$

From time to time, the DSP provides power consumption data derived from POWER to the controller 108.

The controller 108 accumulates the power consumption data until a predefined watt-hour threshold has been reached. At that point, the controller 108 generates a power consumption pulse and increments a power consumption counter. The power consumption counter is the number by which customer energy consumption is tracked. For example, as is well known, a utility may determine a particular customer's consumption for a particular billing cycle by subtracting the power consumption counter value at the beginning of the billing cycle from the power consumption counter value at the end of the billing cycle. The controller 108 preferably provides the power consumption counter information to both the nonvolatile memory 110 and the display 112. The display 112 then provides a visual representation of the power consumption counter information from which readings may be taken by utility personnel. The nonvolatile memory 110 stores the power consumption counter information for the purposes of retention in the case of a power interruption.

Optionally, the controller 108 further provides the power consumption counter information, as well as other information, to the communication circuit 114. The communication circuit 114 may then communicate the information over an external communication means, such as a public telephone network, to a central processing facility for the utility. In this manner, the utility may track and bill for power consumption registered by the meter 10 without requiring an employee to physically view the meter.

The controller 108 also generally controls the operation of the conversion circuit 106, and particularly, the first and second multiplexers 116 and 118, respectively, the first and second A/D converters 122 and 124, respectively, and the DSP 128.

In addition to metering energy consumption, the DSP 128 also determines and provides other information to the controller 108. In particular, the DSP 128 provides for each phase, the measured voltage magnitude and phase angle data, and the measured current magnitude and phase angle data. To determine the measured voltage and current magnitude data, the DSP 128 performs an RMS calculation on each digital voltage and current measurement signal. This calculation may for example, include, for each phase voltage and current, squaring each sample of the digital measurement signal, and taking the mean of the squared samples over time.

To determine phase angles for each voltage, the DSP 128 uses the time differences between the zero crossings of the phase voltage signals. The time difference between the zero crossing of a particular signal $V_x$ and the $V_A$ signal, plus the direction of the respective zero crossings, provides the phase information. Current phase information is determined using watts per phase and VAR per phase. In particular, a current phase angle for phase x is given by arctan ($\text{VAR}_x/\text{WATTS}_x$).

The DSP 128 provides the measured voltage and current magnitude and phase angle data to the controller 108. Table 1, below shows the measured values so provided.

TABLE 1

| | |
|---|---|
| $\text{VRMS}_A =$ | Phase A voltage magnitude |
| $\text{VRMS}_B =$ | Phase B voltage magnitude |
| $\text{VRMS}_C =$ | Phase C voltage magnitude |
| $\text{IRMS}_A =$ | Phase A current magnitude |
| $\text{IRMS}_B =$ | Phase B current magnitude |
| $\text{IRMS}_C =$ | Phase C current magnitude |
| $V<_A =$ | Phase A voltage phase angle |
| $V<_B =$ | Phase B voltage phase angle |
| $V<_C =$ | Phase C voltage phase angle |
| $I<_A =$ | Phase A current phase angle |
| $I<_B =$ | Phase B current phase angle |
| $I<_C =$ | Phase C current phase angle |

It is noted that the controller 108 may be required to perform some further conversion on the measured data to put it in the form identified in Table 1.

As previously indicated herein, the meter 10 performs a self-calibration operation to ensure that it is accurately measuring power consumption. In particular, errors in measuring current magnitude and phase angle are a primary cause for inaccurate power consumption measurements. Accordingly, the present invention is disclosed with an emphasis towards current measurement calibration. However, inaccurate power consumption measurements attributable to voltage measurement errors can also be addressed in accordance with principles of the present invention.

As shown in FIG. 2, the controller 108 includes an input 130 for receiving electrical pulses from a highly accurate power measurement device (not shown in FIG. 2—see FIG. 1), such as a watt hour standard meter which is known in the art. According to an exemplary embodiment, the meter 10 and the watt hour standard meter both receive electrical power from a common source (not shown in FIG. 2) and perform power measurement operations. The watt hour standard meter generates electrical pulses at a frequency representative of the measured power, and provides these electrical pulses to the controller 108 via the input 130. From these pulses, the controller 108 determines the quantity of power measured by the watt hour standard meter for a given time period. The controller 108 then compares the quantity of power measured by the watt hour standard meter for this given time period to the quantity of power measured by the DSP 128 for the same time period. Based on this comparison, the controller 108 determines whether the meter 10 is accurately measuring power consumption. In the event that the meter 10 is not accurately measuring power consumption, the controller 108 enables performance of a self-calibration operation to improve the accuracy of the meter 10. In particular, the controller 108 causes the meter 10 to compensate for errors in measurements of current magnitude and/or current phase angle.

According to an exemplary embodiment, the controller 108 compensates for current magnitude errors by generating a compensation signal which causes the DSP 128 to multiply the current measurement signals by an appropriate scalar value. According to an alternative embodiment, a scalar multiplier (not shown) is interposed between the first A/D converter 122 and the DSP 128 and performs a scalar multiplication operation upon the current measurement signals in dependence upon the compensation signal generated by the controller 108.

According to an exemplary embodiment, the controller 108 compensates for current phase angle errors by generating a compensation signal which causes the DSP 128 to impose a time delay upon the current measurement signals provided by the first A/D converter 122. According to an alternative embodiment, a delay unit (not shown) is interposed between the first A/D converter 122 and the DSP 128 and imposes a time delay upon the current measurement signals in dependence upon the compensation signal generated by the controller 108. Further details regarding self-calibration according to the present invention will be provided later herein.

Figure 3:
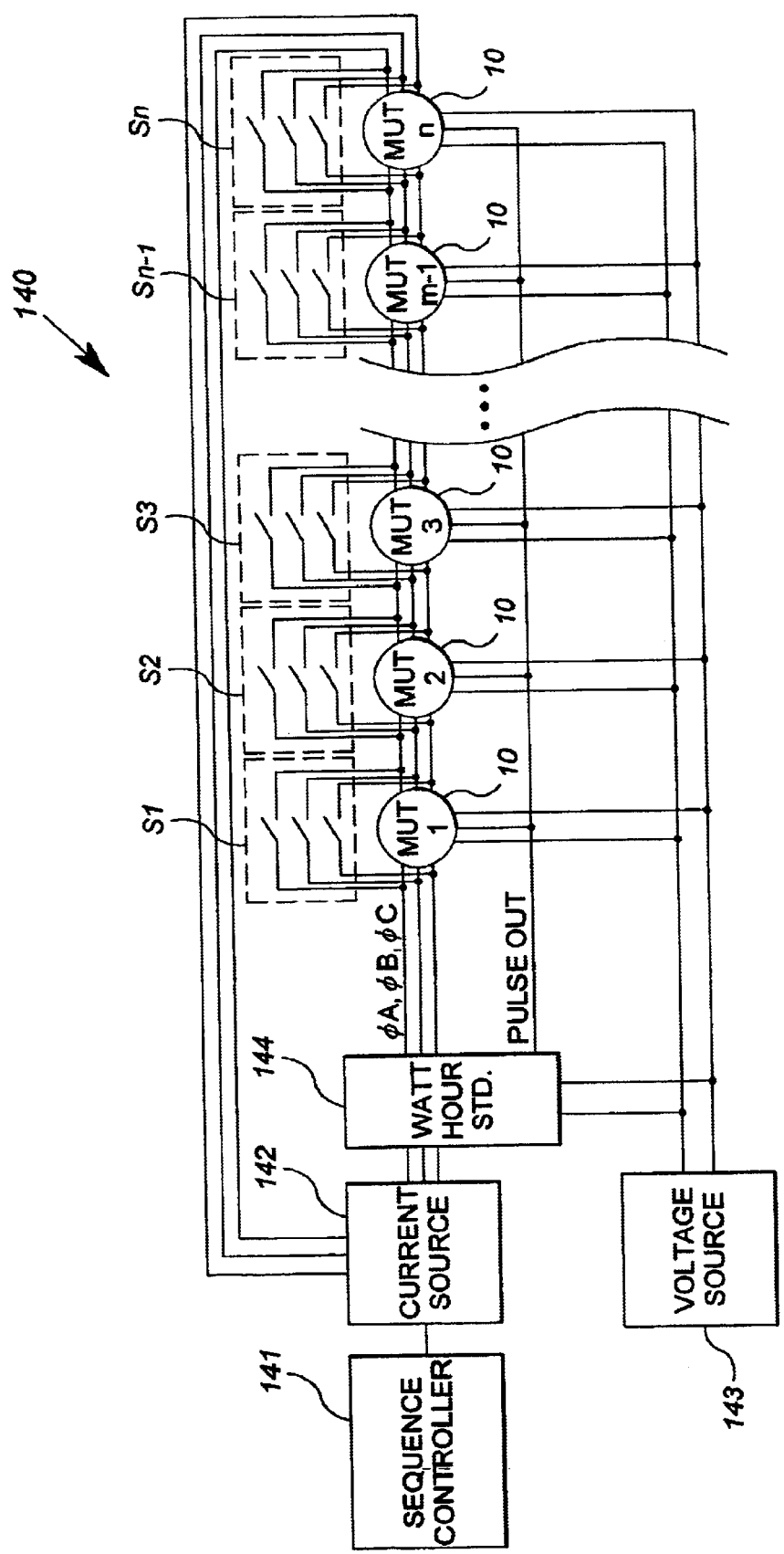
FIG. 3 is an exemplary configuration for enabling self-calibration of a plurality of electricity meters.

According to principles of the present invention, a plurality of meters 10 can be connected together and self-calibrated at the same time. Referring now to FIG. 3, an exemplary configuration 140 for enabling such self-calibration of a plurality of meters 10 is shown.

In FIG. 3, a sequence controller 141 generates and outputs control signals to enable simulation of various test conditions. A current source 142 receives the control signals from the sequence controller 141, and outputs test currents in dependence upon the control signals. A voltage source 143 generates and outputs a test voltage to form a voltage loop as shown in FIG. 3. A watt hour standard meter 144 receives the test currents from the current source 142 and the test voltage from the voltage source 143, and performs a power measurement operation based thereon. As previously indicated, the watt hour standard meter 144 is a highly accurate power measurement device which is known in the art. According to an exemplary embodiment, the power measured by the watt hour standard meter 144 is three-phase electrical power. However, it will be appreciated that one or more individual phases can likewise be measured according to principles of the present invention.

The watt hour standard meter 144 outputs the test currents (i.e., $\phi A$, $\phi B$ and $\phi C$), and also outputs pulses (i.e., Pulse Out) at a frequency representative of the measured power. A plurality of meters under test ("MUTs") are connected to a calibration rack. Each of the meters 10 receives the test currents in a serial manner, and also receives the test voltage from the voltage source 143. Moreover, each meter 10 receives the output pulses from the watt hour standard meter 144 and from these pulses determines the quantity of power measured by the watt hour standard meter 144 for a given time period.

As shown in FIG. 3, there are "n" meters 10 (i.e., MUT 1, MUT 2, MUT 3 . . . MUT n-1, MUT n) being calibrated at the same time. According to a preferred embodiment, "n" is between 15 and 20, although a greater or fewer number of meters 10 can also be used. Moreover, it should be appreciated that the self-calibration operation of the present invention can be applied to a single meter 10. Also in FIG. 3, each meter 10 of the configuration 140 is equipped with shunting devices S1, S2, S3 . . . $S_{n-1}$ and Sn on its current circuits so that a meter 10 finished calibrating can be disconnected from the calibration rack without disturbing other meters 10 that are still calibrating. It is noted that the configuration 140 of FIG. 3 provides open link calibration. It is recognized, however, that the principles of the present invention can likewise be applied to configurations which provide closed link calibration.

To effectuate self-calibration in FIG. 3, each meter 10 of the configuration compares the quantity of power measured by the watt hour standard meter 144 for a given time period to the quantity of power measured by the meter 10 for the same time period. Based on this comparison, the meter 10 determines whether it is accurately measuring power consumption. In the event that the meter 10 is not accurately measuring power consumption, a self-calibration operation is performed in a manner previously described herein to improve the accuracy of the meter 10. As previously indicated, self-calibration is performed according to principles of the present invention to compensate for measurement errors in current magnitude and/or current phase angle. Further details regarding self-calibration according to an exemplary embodiment of the present invention will now be provided.

Figure 4:
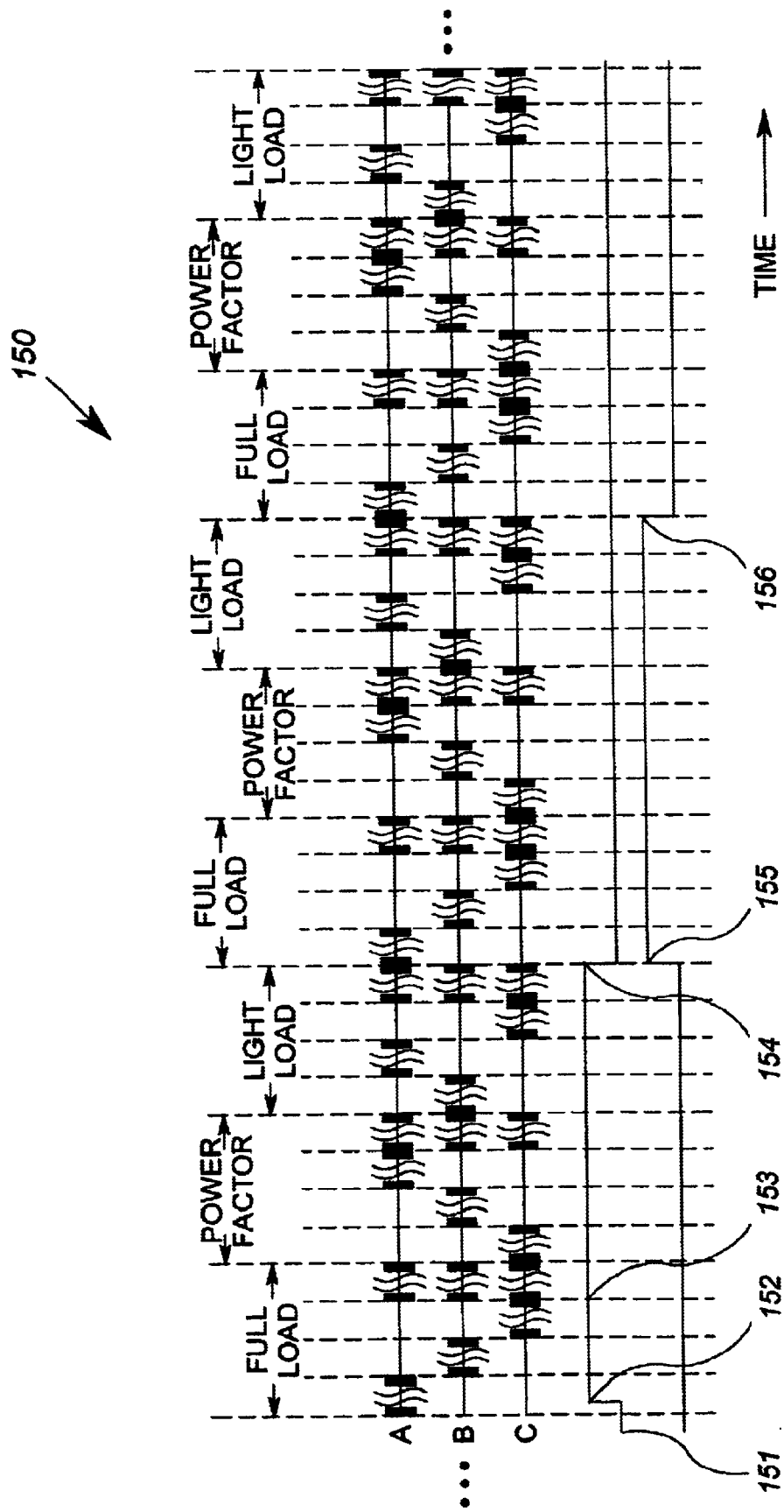
FIG. 4 is a timing diagram illustrating a successful self-calibration operation.

Referring now to FIG. 4, a schematic diagram 160 illustrating a successful self-calibration operation is shown. In particular, FIG. 4 illustrates a sequence of test currents used to perform self-calibration according to principles of the present invention. As previously indicated, these test currents may be concurrently provided to a plurality of meters 10, or to only a single meter 10. For purposes of example and explanation, however, the following description will be provided assuming that the test currents are provided to a plurality of meters 10 in the configuration 140 of FIG. 3.

To enable the operation depicted in FIG. 4, the meters 10 are connected to the calibration rack and powered up. This state is represented by reference numeral 151 wherein a first internal flag of each meter's 10 controller 108 is set to a binary low state. The sequence controller 141 then generates control signals which cause the current source 142 to generate the test currents illustrated in FIG. 4. The voltage source 143 may be assumed to output a fixed voltage. The watt hour standard meter 144 receives the test currents from the current source 142 and the voltage from the voltage source 143 and begins measuring power. In particular, the watt hour standard meter 144 outputs a pulse (i.e., Pulse Out) at a frequency corresponding to the quantity of power measured.

Each of the meters 10 receives the test currents via the watt hour standard meter 144 in a serial manner, and also receives the test voltage from the voltage source 143. Moreover, each meter 10 receives the output pulses from the watt hour standard meter 144. According to an exemplary embodiment, receipt of the output pulses from the watt hour standard meter 144 causes each meter 10 to detect the beginning of a calibration mode, wherein each meter 10 performs a self-calibration operation. In response to detecting the calibration mode, the first internal flag of each meter's 10 controller 108 is shifted from the binary low state to a binary high state as represented by reference numeral 152. According to an exemplary embodiment, a meter's 10 display 112 provides a visual indication such as a text message, a yellow light illumination or other visual indication, to represent that the self-calibration operation is in progress.

As shown in FIG. 4, the test current sequence of the present invention includes three distinct intervals: a full load interval, a power factor interval and a light load interval. Each interval has a unique phase sequence associated therewith. For example, the full load sequence is phase A, phase B, phase C, all three phases, while the power factor sequence is phase C, phase B, phase A, all three phases, and the light load sequence is phase B, phase A, phase C, all three phases. The unique sequences allow a meter to be connected to a free running calibration system and automatically synchronize itself to the system.

In FIG. 4, the displacement between adjacent dashed lines within an interval represents a fixed time period, which according to a preferred embodiment is 20 seconds. Therefore, according to a preferred embodiment, each interval of the test current sequence is 80 seconds in duration. Other durations, however, may be employed. As will be explained herein, each of the intervals enables a specific aspect of the self-calibration operation to be performed.

The full load interval enables each meter 10 to self-calibrate its current magnitude measurements. During the full load interval, the current source 142 generates a test current at the "full load" level for the meters 10 under test. Typically, the full load current is 10% of the maximum rated current. The generated full load current, which may, for example, be 30 amps, is generated to be in phase with the voltage generated by the voltage source 143.

The test current is sequentially provided for each phase as indicated in FIG. 4 using the full load sequence phase A, phase B, phase C. After receiving the test current for 20 seconds at phase C, each meter 10 detects the full load calibration sequence at the point represented by reference numeral 153. After the full load calibration sequence is completed at 153, the test current is applied to all three phases (i.e., A, B and C) for the final 20 seconds of the full load interval. During this final 20 seconds of the full load interval, each meter 10 internally performs a power measurement operation and also receives pulses representing the power measured by the watt hour standard meter 144. When the full load interval ends, each meter 10 compares the quantity of power measured by the watt hour standard meter 144 during this 20 second time period to the quantity of power it internally measured during the same time period. The comparison is preferably done on a per phase basis. Based on this comparison, the controller 108 determines whether the meter 10 is accurately measuring power consumption. In particular, when the power measurements on any phase generated by the meter 10 and the watt hour standard meter 144 during the full load interval differ by an amount in excess of a predetermined threshold, the meter 10 concludes that it is not measuring power accurately and performs a corresponding self-calibration operation. It is noted that the predetermined threshold may suitably be zero.

The full load interval calibration operation described above provides an indication of the current magnitude measurement errors. Because the full load measurement is performed at unity power factor, small phase errors will not cause significant measurement errors. Accordingly, any error detected during the full load interval is presumed to be a current measurement error.

According to an exemplary embodiment, a controller 108 of a given meter 10 performs self-calibration for current magnitude measurements by generating a compensation signal which causes the DSP 128 to multiply its current measurement signals on each phase by an appropriate scalar value. According to an alternative embodiment, a scalar multiplier (not shown) is interposed between the first A/D converter 122 and the DSP 128 and performs a scalar multiplication operation upon the current measurement signals in dependence upon the compensation signal generated by the controller 108. In any event, after the full load interval is completed, a meter 10 under test is assumed to accurately measure current magnitudes.

Following the full load interval is the so-called power factor interval. The power factor interval enables each meter 10 to self-calibrate its current phase angle measurements. During the power factor interval, the current source 142 generates a test current, for example 30 amps, which is 60° out of phase with the voltage generated by the voltage source 143. This phase difference of 60° corresponds to a power factor of 0.5. The power factor interval provides an indication of phase error for two reasons. First, when the power factor is 0.5, phase error has a significant effect on power measurements. Second, since the magnitude error has already been compensated, any remaining error should be attributable to phase error.

During the power factor interval, each meter 10 internally performs a power measurement operation and also receives pulses representing the power measured by the watt hour standard meter 144. When the power factor interval ends, each meter 10 compares for each phase the quantity of power measured by the watt hour standard meter 144 during the interval to the quantity of power it internally measured during the interval. Based on this comparison, the controller 108 determines whether the meter 10 is accurately measuring power consumption. In particular, when the power measurements generated by the meter 10 and the watt hour standard meter 144 during the power factor interval differ by an amount in excess of a predetermined threshold, the meter 10 concludes that it is not measuring power accurately and performs a corresponding self-calibration operation for current phase angle measurements.

However, it is noted that in some cases, the power factor measurement may be carried out before the full load measurement, so that any magnitude error has not yet been compensated. In such a case, the measurement error observed during the power factor interval is not necessarily attributable primarily to phase error. Accordingly, to determine the phase error, the error measured during the power factor interval is stored. Then, the full load interval is subsequently completed, and the measurement error observed during the full load interval is stored. The phase error may be derived from the error measured during the full load interval and the error measured during the power factor interval.

To this end, it is noted that the measurement error from the full load interval is primarily the magnitude error. That magnitude error may be mathematically removed from the power factor interval measurements, thereby leaving the measurement error that is attributable to phase error.

In any event, according to an exemplary embodiment, a controller 108 of a given meter 10 performs self-calibration for current phase angle measurements by generating a compensation signal which causes the DSP 128 to impose a time delay upon the current measurement signals provided by the first A/D converter 122. According to an alternative embodiment, a delay unit (not shown) is interposed between the first A/D converter 122 and the DSP 128 and imposes a time delay upon the current measurement signals in dependence upon the compensation signal generated by the controller 108. In any event, after the power factor interval is completed, a meter 10 under test is assumed to accurately measure current phase angles.

Following the power factor interval is the light load interval. The light load interval enables each meter 10 to obtain a separate set of calibration information for implementation during light load situations. In particular, the behavior of certain common metering components can become non-linear at or near light load levels. Thus, it is not unusual to implement a special light load calibration factor that is employed instead of the magnitude error compensation factor. During the light load interval, the current source 142 generates a lower test current, for example 3 amps, which is in phase (i.e., unity power factor) with the voltage generated by the voltage source 143. Like the other intervals, during the light load interval, each meter 10 internally performs a power measurement operation and also receives pulses representing the power measured by the watt hour standard meter 144. When the light load interval ends, each meter 10 compares the quantity of power measured by the watt hour standard meter 144 during the interval to the quantity of power it internally measured during the interval. Based on this comparison, the controller 108 determines whether the meter 10 has been properly calibrated. Each meter 10 detects the end of the light load interval at the point represented by reference numeral 154, where the first internal flag of each meter's 10 controller 108 is shifted from a binary high state to a binary low state.

Following the light load interval, each meter 10 detects the start of a separate calibration verification mode at a point represented by reference numeral 155. In response to detecting the verification mode, a second internal flag of each meter's 10 controller 108 is shifted from a binary low state to a binary high state. The verification mode is comprised of sequentially repeating the full load interval, power factor interval and the light load interval in the manner previously described herein. However, instead of generating compensation signals, the controller 108 merely determines whether the values measured within the meter 10 are sufficiently similar to the values measured by the watt hour standard meter 144. Accordingly, the verification mode operates as an added degree of assurance that a meter 10 has been properly calibrated. Each meter 10 under test detects the when the verification mode is complete at a point represented by reference numeral 156, where the second internal flag of each meter's 10 controller 108 is shifted from a binary high state to a binary low state. As shown in FIG. 4, the first internal flag of a meter's 10 controller 108 is maintained in the binary low state during and after the verification mode to indicate that the self-calibration operation was successful (i.e., differences between current magnitude and phase angle measurements by the watt hour standard meter 144 and meter 10 are within predetermined thresholds). According to an exemplary embodiment, a meter's 10 display 112 provides a visual indication such as a text message, a green light illumination or other visual indication, to represent that the self-calibration operation has been successfully performed. This successful result, however, may not always be the case as will now be explained.

Figure 5:
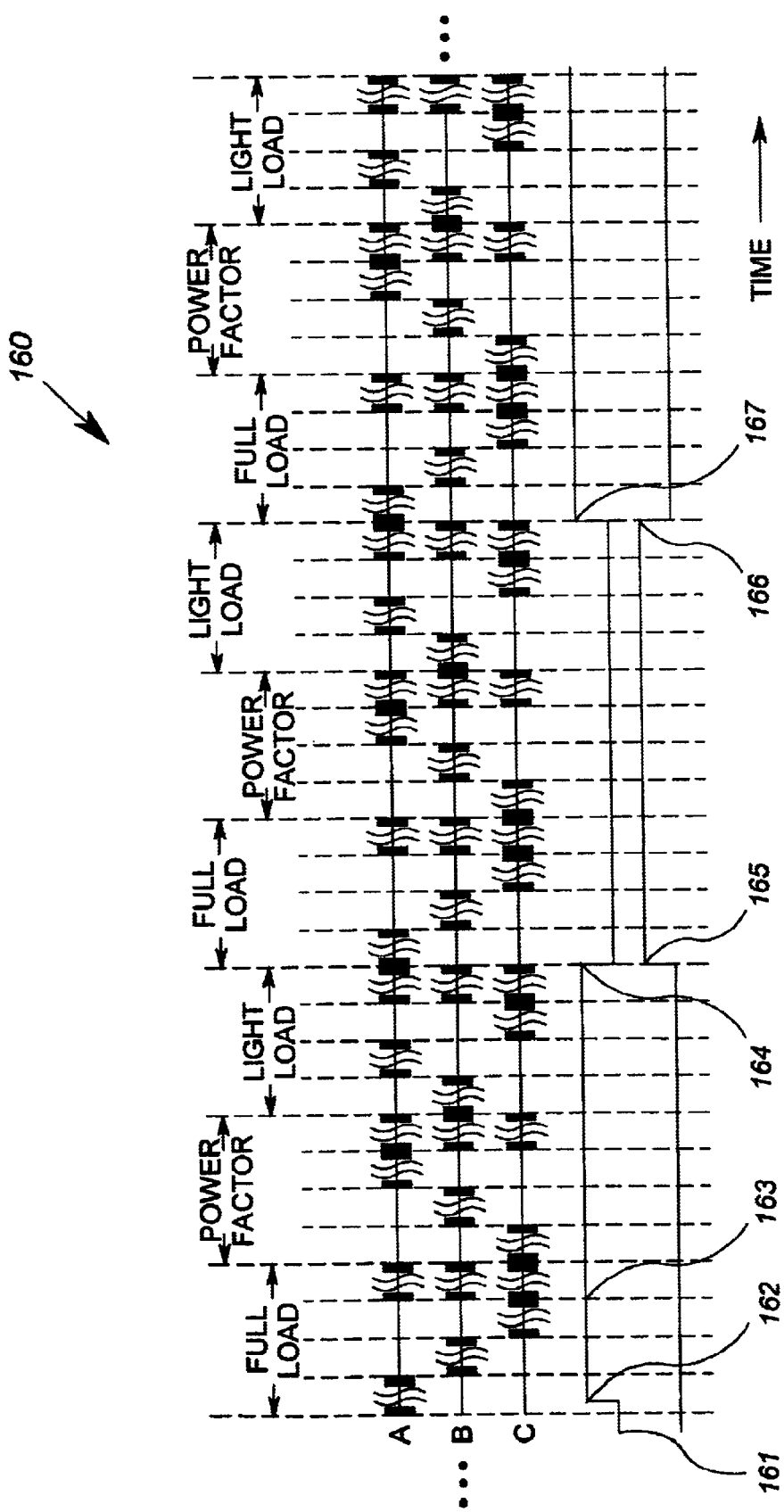
FIG. 5 is a timing diagram illustrating an unsuccessful self-calibration operation.

Referring to FIG. 5, a schematic diagram 170 illustrating an unsuccessful self-calibration operation is shown. Like FIG. 4, FIG. 5 also illustrates a sequence of test currents used to perform self-calibration according to principles of the present invention. In FIG. 5, however, the meter 10 under test determines the self-calibration operation to be unsuccessful after the verification mode. In FIG. 5, reference numerals 161 through 166 respectively correspond to the reference numerals 151 through 156 in FIG. 6. That is, reference numeral 161 represents the point at which a meter 10 is connected to the calibration rack and powered up. Reference numeral 162 represents the point at which the meter 10 detects the calibration mode. Reference numeral 163 represents the point at which the meter 10 detects the calibration current sequence, and that the full load test should be performed. Reference numeral 164 represents the point at which the meter 10 detects completion of the calibration mode. Reference numeral 165 represents the point at which the meter 10 detects the beginning of the verification mode. Reference numeral 166 represents the point at which the meter 10 detects completion of the verification mode. In FIG. 5, however, reference numeral 167 represents the point at which the meter 10 under test determines the self-calibration operation to be unsuccessful (i.e., differences between current magnitude and phase angle measurements by the watt hour standard meter 144 and meter 10 are not within predetermined thresholds). According to an exemplary embodiment, a meter's 10 display 112 provides a visual indication such as a text message, a red light illumination or other visual indication, to represent that the self-calibration operation has not been successfully performed.

Figure 6A:
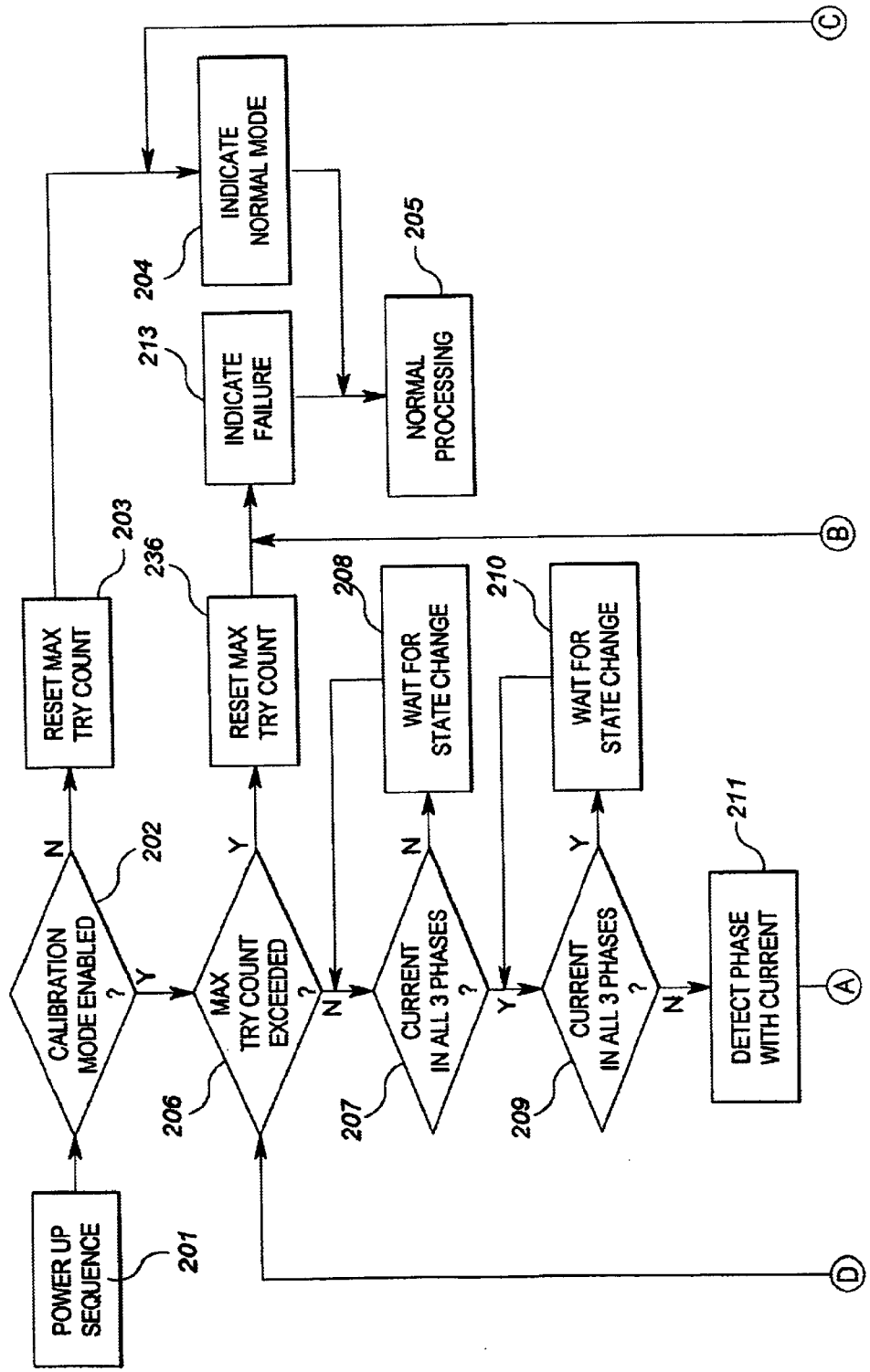
FIGS. 6A and 6B are a flowchart illustrating exemplary steps for practicing the present invention.
Figure 6B:
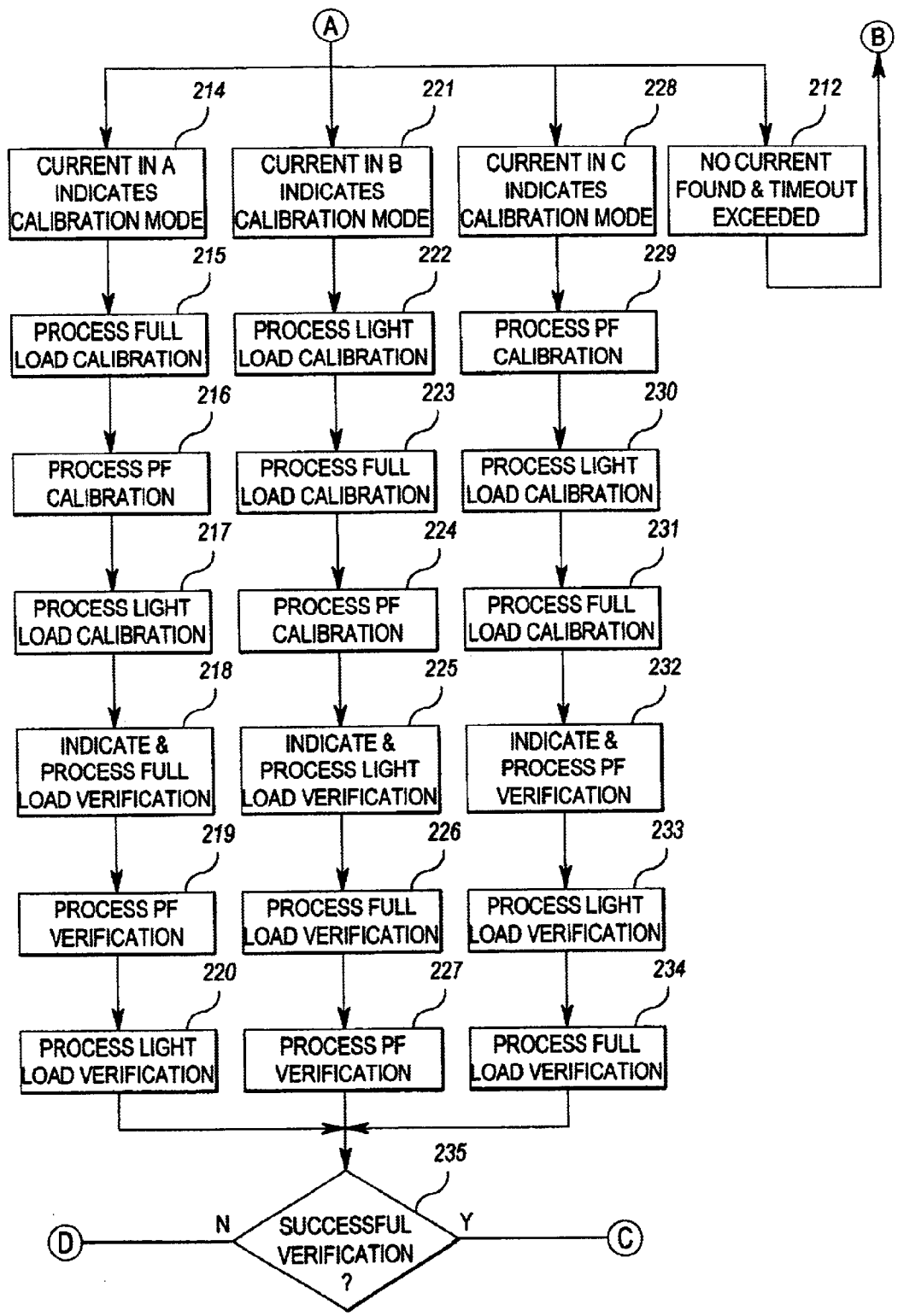

Referring now to FIGS. 6A and 6B, a flowchart illustrating exemplary steps for practicing the present invention is shown. For simplicity, these steps will be described in relation to a single meter 10. However, it should be recognized that the following steps may be performed simultaneously by a plurality of meters 10.

At step 201, a given meter 10 completes a power up sequence in preparation for performing a self-calibration operation. Next, at step 202, the meter's 10 controller 108 determines whether the calibration mode is enabled. If the calibration mode is not enabled, process flow advances to step 203 where the microcontroller 108 resets a "max try count" value. The max try count value represents the maximum number of times the meter 10 can unsuccessfully perform self-calibration before a calibration failure condition is indicated on the display 112. As previously indicated, detection of an unsuccessful self-calibration operation is represented, for example, by reference numeral 167 in FIG. 5. After the max try count value is reset at step 203, process flow advances to step 204 where a normal mode indication is provided on the display 112. Then, at step 205, the meter 10 performs normal processing operations to measure power consumption.

Referring back to step 202, if the calibration mode is enabled, process flow advances to step 206 where the controller 108 determines whether the max try count value exceeds a predetermined threshold. Upon initial power up, the max try count value will not be exceeded and process flow advances to step 207 where the controller 108 determines whether current is present in all three phases. If current is not present in all three phases, the controller 108 waits for a state change to the contrary at step 208 and loops back to step 207. Once current is detected in all three phases at step 207, process flow advances to step 209 where the controller 108 continues to detect whether current is present in all three phases. If current is present in all three phases, the controller 108 waits for a state change to the contrary at step 210 and loops back to step 209. Once the controller 108 detects that current is not present in all three phases at step 209, process flow advances to step 211 where the controller 108 detects one phase having current. In particular, the purpose of step 209 is so that the controller 108 can detect the edge of a state change between when current is present and not present. The detection performed at steps 207 and 209 may, for example, each correspond to reference numerals 153 and 163 in FIGS. 4 and 5, respectively.

If no current is detected in any phase at step 211 within a predetermined time period, process flow advances to step 212 where this condition is recognized by the controller 108. Process flow then advances to step 213 where a failure condition is indicated on the display 112. Alternatively, if current is detected in a phase at step 211, process flow advances to enable the self-calibration operation. The self-calibration mode is enabled, for example, when the first internal flag of the meter's 10 controller 108 is shifted from a binary low state to a binary high state as represented by reference numerals 152 and 162 in FIGS. 4 and 5, respectively.

Assuming current is first detected in phase A as indicated at the beginning of FIGS. 4 and 5, process flow advances in FIG. 6B to step 214 where the controller 108 recognizes this condition and enables the display 112 to indicate that the calibration mode has been entered. Next, at step 215, the controller 108 processes power measurement data corresponding to the full load interval, and performs a calibration operation to compensate for current magnitude errors. Next, at step 216, the controller 108 processes power measurement data corresponding to the power factor interval, and performs a calibration operation to compensate for current phase angle errors. Then, at step 217, the controller 108 processes power measurement data corresponding to the light load interval, and performs a calibration information to compensate for light load errors. After step 217, the calibration mode is completed.

After the calibration mode is completed, the controller 108 detects the beginning of the verification mode, as represented for example by reference numerals 155 and 165 in FIGS. 4 and 5, respectively. Accordingly, the verification mode proceeds at step 218 in FIG. 6B by the controller 108 enabling the display 112 to indicate that the verification mode has been entered and repeating the full load interval. Next, the controller 108 continues the verification mode by repeating the power factor interval and the light load interval at steps 219 and 220, respectively.

Referring back to step 211, assuming current is first detected in phase B, process flow advances in FIG. 6B to step 221 where the controller 108 recognizes this condition and enables the display 112 to indicate that the calibration mode has been entered. Then, at step 222, the controller 108 processes power measurement data corresponding to the light load interval and performs a calibration operation to compensate for light load errors. Next, at step 223, the controller 108 processes power measurement data corresponding to the full load interval and performs a calibration operation to compensate for current magnitude errors. Then, at step 224, the controller 108 processes power measurement data corresponding to the power factor interval, and performs a calibration operation to compensate for current phase angle errors, thus completing the calibration mode.

After the calibration mode is completed, the controller 108 detects the beginning of the verification mode. Accordingly, the verification mode proceeds at step 225 in FIG. 6B by the controller 108 enabling the display 112 to indicate that the verification mode has been entered and repeating the light load interval. Next, the controller 108 continues the verification mode by repeating the full load interval and the power factor interval at steps 226 and 227, respectively.

Referring again back to step 211, assuming current is first detected in phase C, process flow advances in FIG. 6B to step 228 where the controller 108 recognizes this condition and enables the display 112 to indicate that the calibration mode has been entered. Then, at step 229, the controller 108 processes power measurement data corresponding to the power factor interval, and records the error. In contrast to steps 216 and 224, the controller 108 cannot immediately determine the phase error from the error measured during the power factor interval. In particular, because the magnitude error has not yet been determined and calibrated (see step 231), the error detected in step 229 is not necessarily due primarily only to phase angle errors. Thus, the measurement error calculated during the power factor interval is merely stored in step 229. The controller 108 determines the phase angle calibration later in step 232.

Next, at step 230, the controller 108 processes power measurement data corresponding to the light load interval to and performs a calibration operation to compensate for light load errors. Then, at step 231, the controller 108 processes power measurement data corresponding to the full load interval and performs a calibration operation to compensate for current magnitude errors, thus completing the calibration mode.

After the calibration mode is completed, the controller 108 detects the beginning of the verification mode. Accordingly, the verification mode proceeds at step 232 in FIG. 6B. Prior to, or during step 232, the controller 232 calculates a phase error calibration using the error stored during step 229 from the power factor interval and the magnitude compensation information developed in step 231. Once the phase error calibration is determined and applied, the controller 108 enables the display 112 to indicate that the verification mode has been entered and repeats the power factor interval. In the remainder of step 232, the controller 108 verifies the phase error calibration similar to steps 227 and 219. Next, the controller 108 continues the verification mode by repeating the light load interval and the full load interval at steps 233 and 234, respectively.

As indicated in FIG. 6B, the controller 108 can automatically synchronize itself to a free running calibration system and perform a self-calibration operation regardless of which phase current is initially detect in.

Regardless of which phase current is initially detected in at step 211, after the verification mode is performed, the controller 108 determines at step 235 whether the verification mode was successful. In the event that the verification was not successful (as detected at reference numeral 167 in FIG. 5), process flow loops back to step 206 where the controller 108 determines whether the max try count value has been exceeded. That is, the controller 108 determines whether there have been a predetermined number of unsuccessful calibration attempts. When the max try count value has not been exceeded, process flow advances to step 207 and proceeds in the manner previously described herein. Alternatively, if the controller 108 determines that the max try count value has been exceeded at step 206, process flow advances to step 236 where the max try count value is reset to zero. Thereafter, a failure indication is provided on the display 112 at step 213, and normal processing proceeds at step 205.

When the controller 108 determines at step 235 that the verification mode is successful, process flow loops back to step 204 where a normal mode indication is provided on the display 112 and normal processing is performed at step 205. In the foregoing manner, the present invention performs a self-calibration operation.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A self-calibrating electricity meter, comprising:
   a measurement circuit configured to receive a preconfigured test signal and generate power-related measurement information corresponding to the preconfigured test signal; and
   an input configured to receive externally-generated reference standard information corresponding to the preconfigured test signal;
   a controller operably coupled to the measurement circuit and the input, wherein the controller compares the measurement information generated by the measurement circuit to the reference standard information and generates a compensation signal in dependence upon the comparison and the compensation signal is used to calibrate the measurement circuit.

2. The self-calibrating electricity meter of claim 1, wherein the measurement circuit multiplies current measurement signals by a scalar quantity in dependence upon the compensation signal.

3. The self-calibrating electricity meter of claim 1, wherein the measurement circuit imposes a time delay upon current measurement signals in dependence upon the compensation signal.

4. The self-calibrating electricity meter of claim 1, further comprising a display for providing a visual indication of a calibration state of the meter.

5. The self-calibrating electricity meter of claim 4, wherein each of the meters further comprises a display for providing a visual indication of a calibration state of the meter.

6. The self-calibrating electricity meter of claim 4, wherein the display illuminates a green light to indicate that the meter has been successfully calibrated.

7. The self-calibrating electricity meter of claim 4, wherein the display illuminates a red light to indicate that the meter has been unsuccessfully calibrated.

8. The self-calibrating electricity meter of claim 1, wherein the meter is capable of being electrically connected to at least one other meter, and calibrated concurrently with the at least one other meter.

9. The self-calibrating electricity meter of claim 1, wherein calibration is performed in a plurality of intervals, a first interval calibrating magnitude measurements and a second interval calibrating phase angle measurements.

10. The self-calibrating electricity meter of claim 9, wherein a third interval is used to verify calibration of the magnitude measurements and the phase angle measurements.

11. The self-calibrating electricity meter of claim 1 wherein the externally-generated reference standard signal includes information regarding the preconfigured test signal.

12. The self-calibrating electricity meter of claim 1 wherein the measurement circuit is configured to receive the preconfigured test signal and the input is configured to receive reference standard signal contemporaneously.

13. The self-calibrating electricity meter of claim 1 wherein the preconfigured test signal includes a signal having a predetermined current magnitude.

14. A method for self-calibrating an electricity meter, comprising steps of:
   generating a preconfigured test signal external to the meter;
   generating power information representative of measured power corresponding to the test signal using a measurement circuit within the meter;
   receiving into the meter reference standard information corresponding to the test signal;
   comparing within the meter the power information to the reference standard information;
   generating within the meter a compensation signal in dependence upon the comparison; and
   generating within the meter subsequent power information using the compensation signal.

15. The method of claim 14, wherein generating the subsequent power information further comprises multiplying current measurement signals by a scalar quantity in dependence upon the compensation signal.

16. The method of claim 14, wherein generating the subsequent power information further comprises imposing a time delay upon current measurement signals in dependence upon the compensation signal.

17. The method of claim 14, further comprising a step of providing a visual display indicating a calibration state of the meter.

18. The method of claim 17, wherein the visual display is a green light to indicate that the meter has been successfully calibrated.

19. The method of claim 17, wherein the visual display is a red light to indicate that the meter has been unsuccessfully calibrated.

20. The method of claim 17, wherein the visual display is a yellow light to indicate that calibration is in progress.

21. The method of claim 14, further comprising steps of:
   electrically connecting the meter to at least one other meter; and
   calibrating the meter concurrently with the at least one other meter.

22. The method of claim 14, wherein the steps of generating the power information, receiving the reference standard information, and comparing the power information to the reference standard information are each performed a plurality of times, a first time to calibrate magnitude measurements and a second time to calibrate phase angle measurements.

23. The method of claim 22, wherein the steps of generating the power information, receiving the reference standard information, and comparing the power information to the reference standard information are each performed a third time to verify calibration of the magnitude measurements and the phase angle measurements.

24. A system, comprising:
   a source of voltage and current signals;
   a reference measurement device configured to generate reference standard information in dependence upon the voltage and current signals; and a plurality of electricity meters, each of the meters including:
- a measurement circuit configured to generate power information in dependence upon the voltage and current signals; and
- a controller operably coupled to the measurement circuit and having an input for receiving the reference standard information, wherein the controller compares the power information generated by the measurement circuit to the reference standard information and generates a compensation signal in dependence upon the comparison and the compensation signal is used to calibrate the measurement circuit.

25. The system of claim 24, wherein the measurement circuit multiplies current measurement signals by a scalar quantity in dependence upon the compensation signal.

26. The system of claim 24, wherein the measurement circuit imposes a time delay upon current measurement signals in dependence upon the compensation signal.

27. The system of claim 24, wherein each of the meters further comprises a display for providing a visual indication of a calibration state of the meter.

28. The system of claim 27, wherein the display illuminates a green light to indicate that the meter has been successfully calibrated.

29. The system of claim 27, wherein the display illuminates a red light to indicate that the meter has been unsuccessfully calibrated.

30. The system of claim 27, wherein the display illuminates a yellow light to indicate that calibration is in progress.

31. The system of claim 24, wherein calibration is performed in a plurality of intervals, a first interval calibrating magnitude measurements and a second interval calibrating phase angle measurements.

32. The system of claim 31, wherein a third interval is used to verify calibration of the magnitude measurements and the phase angle measurements.

* * * * *